(12) United States Patent
Duensing et al.

(10) Patent No.: US 11,204,403 B2
(45) Date of Patent: Dec. 21, 2021

(54) DONGLE FOR MAGNETIC RESONANCE IMAGING

(71) Applicant: KONINKLIJKE PHILIPS N.V., Eindhoven (NL)

(72) Inventors: George Randall Duensing, Gainsville, FL (US); Olli T. Friman, Gainsville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 412 days.

(21) Appl. No.: 16/080,319

(22) PCT Filed: Feb. 9, 2017

(86) PCT No.: PCT/EP2017/052901
§ 371 (c)(1),
(2) Date: Aug. 28, 2018

(87) PCT Pub. No.: WO2017/148681
PCT Pub. Date: Sep. 8, 2017

(65) Prior Publication Data
US 2019/0086491 A1     Mar. 21, 2019

Related U.S. Application Data

(60) Provisional application No. 62/301,663, filed on Mar. 1, 2016.

(51) Int. Cl.
G01R 33/36  (2006.01)
H01M 10/627  (2014.01)
H02J 7/00  (2006.01)

(52) U.S. Cl.
CPC ..... *G01R 33/3621* (2013.01); *G01R 33/3692* (2013.01); *H01M 10/627* (2015.04); *H02J 7/0021* (2013.01); *H02J 7/0045* (2013.01)

(58) Field of Classification Search
CPC .................................................. G01R 33/3621
(Continued)

(56) References Cited

U.S. PATENT DOCUMENTS 7,619,415 B2   11/2009  Nakabayashi
8,455,987 B1 *  6/2013  Spann ............... H01L 23/49562
                                                  257/675
(Continued)

FOREIGN PATENT DOCUMENTS

GN   204905316 U   12/2015
JP   2014031118 A   2/2014

OTHER PUBLICATIONS

"Self Sorting Battery Charcing Station Powers Almost All of Them" URL:http://www.greendiary.com/self-sorting-battery-charging-Station-powers-almost-al-of-them.html Feb. 6, 2010.
(Continued)

*Primary Examiner* — Edward Tso
*Assistant Examiner* — Ahmed H Omar

(57) ABSTRACT

A dongle includes: a battery configured to provide direct current (DC) power to a device to which the dongle is electrically and mechanically connected. The battery is adapted to be removed and replaced by another battery. A heat sink configured to dissipate heat generated by the battery is adapted to be removed and replaced by another heat sink.

20 Claims, 6 Drawing Sheets

(58) Field of Classification Search
USPC .................................................. 320/107, 114
See application file for complete search history.

(56) References Cited

U.S. PATENT DOCUMENTS

| | | | | |
|---|---|---|---|---|
| 9,187,004 | B1* | 11/2015 | Davis | H01M 10/42 |
| 9,845,124 | B1* | 12/2017 | Ingram | B60L 50/40 |
| 2006/0279284 | A1 | 12/2006 | Vaughan | |
| 2008/0272786 | A1 | 11/2008 | Luedeke | |
| 2009/0030305 | A1* | 1/2009 | Hoogeveen | G01R 33/3621 |
| | | | | 600/422 |
| 2009/0060127 | A1 | 3/2009 | Ohta et al. | |
| 2010/0090699 | A1 | 4/2010 | Haans et al. | |
| 2010/0188208 | A1 | 7/2010 | Fisher et al. | |
| 2011/0012598 | A1 | 1/2011 | Van Helvoort et al. | |
| 2011/0059347 | A1 | 3/2011 | Lee et al. | |
| 2011/0103491 | A1* | 5/2011 | Saes | G01R 33/3621 |
| | | | | 375/241 |
| 2011/0238343 | A1 | 9/2011 | Kamiya et al. | |
| 2016/0056650 | A1 | 2/2016 | Hall | |
| 2016/0061916 | A1 | 3/2016 | Duensing et al. | |

OTHER PUBLICATIONS

Upegui et al: "Ubichip, Ubidule,and MarXbot: A Hardware Platform for the Simulation of Complex Systems",Sep. 6, 2010 (Sep. 6, 2010),Network and Parallel Computing; [Lecture Notes in Computer Science; Lect.Notes Computer], Springer International Publishing, Cham, pp. 286-298.

Yasuo Saito et al: "Development of a battery support system for the prolonged activity of mobile robots". Electronics and Communications in Japan, Scripta Technica. New York, US, vol. 94, No. 3, Mar. 1, 2011 (Mar. 1, 2011).

Kurt A Swieringa et al: "Autonomous battery swapping system for small-scale helicopters".2010 IEEE International Conference On Robotics and Automation : ICRA 2010 ;Anchorage, Alaska, USA, May 3-8, 2010,IEEE, Piscataway, NJ, USA,May 3, 2010 (May 3, 2010), pp. 3335-3340.

Ure N Kemal et al: "An Automated Battery Management System to Enable Persistent Missions With Multiple Aerial Vehicles", IEEE / ASME Transactions On Mechatronics, IEEE Service Center, Piscataway, NJ, US, vol. 20, No. 1,Feb. 1, 2015 (Feb. 1, 2015), pp. 275-286.

* cited by examiner

DONGLE FOR MAGNETIC RESONANCE IMAGING

CROSS REFERENCE TO RELATED APPLICATIONS

This application is a U.S. national phase application of International Application No. PCT/EP2017/052901, filed on Feb. 9, 2017, which claims the benefit of U.S. provisional Application Ser. No. 62/301,663 filed on Mar. 1, 2016 and is incorporated herein by reference.

BACKGROUND

Magnetic resonance imaging (MRI) systems often use body coils disposed over a patient examination space of an MR imaging system for imaging a whole body to be examined, and in the form of RF/MR surface or local coils which are directly arranged on a local zone or area to be examined.

Radio frequency (RF) coils acquire analogue signals that are sampled and digitized. In some modern coils, the digitization happens locally, for example within the coil housing.

In known systems, electrical (DC) power is provided to the local coil by a cable that is connected to the system. The cable often also includes a signal transmission line, such as a coaxial cable for transmission of data from the local coil. These cables are often referred to as RF cables. RF cables are a common source of failure, and are comparatively expensive. Moreover, the RF cables can become excessively hot and cause burns. Moreover, known cables including the RF and power cable are labor intensive to set up for a patient scan.

What is needed, therefore, is an apparatus that overcomes at least the shortcomings described above.

SUMMARY

In accordance with a representative embodiment, a dongle comprises: a battery configured to provide direct current (DC) power to a device to which the dongle is electrically and mechanically connected. The battery is adapted to be removed, and replaced by another battery. The dongle further comprises a heat sink configured to dissipate heat generated by the battery. The heat sink is adapted to be removed, and replaced by another heat sink.

In accordance with another representative embodiment, an apparatus comprises: a carousel comprising a cavity into which a dongle is inserted; a switch disposed in the cavity, the switch being depressed upon insertion of the dongle into the cavity; and a battery charger connected to a plurality of charge sites. Each charge site is configured to receive and charge a battery. When a battery disposed in the dongle is removed and disposed in one of the charge sites, the carousel advances, and a battery disposed in a charge site is inserted into the dongle.

In accordance with another representative embodiment, a non-transitory computer-readable storage medium has stored therein machine readable instructions configured to be executed by a processor to control an apparatus. The machine readable instructions are configured to perform a method to exchange a battery in a dongle. The method comprises: receiving a current level of charge for each of a plurality of batteries disposed in respective battery sites in a carousel of the apparatus; determining which of the plurality of batteries has the greatest level of charge; receiving a level of charge of a dongle battery; comparing the greatest level of charge with the level of charge of the dongle battery; and advancing the carousel to replace the dongle battery with the battery having the greatest level of charge when the greatest level of charge is greater than the level of charge of the dongle battery.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
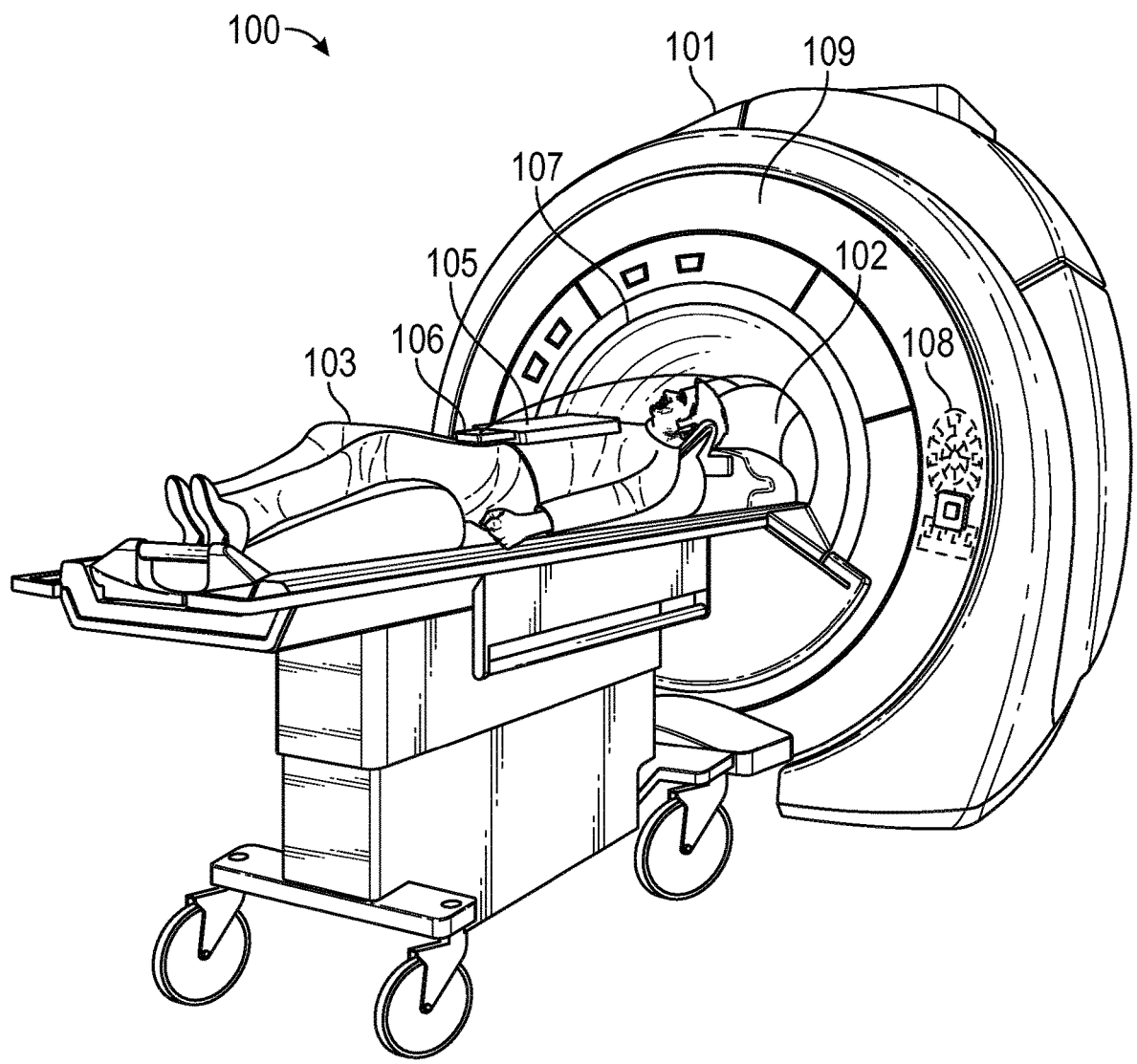
FIG. 1A is a perspective view of an MR system in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' comprises both singular and plural referents, unless the context clearly dictates otherwise. Thus, for example, 'a device' includes one device and plural devices.

As used herein, the statement that two or more parts or components are "connected" shall mean that the parts are joined or operate together either directly or indirectly, i.e., through one or more intermediate parts or components, so long as a link occurs.

Directional terms/phrases and relative terms/phrases may be used to describe the various elements' relationships to one another, as illustrated in the accompanying drawings. These terms/phrases are intended to encompass different orientations of the device and/or elements in addition to the orientation depicted in the drawings.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

FIG. 1A is a perspective view of an MRI system 100 in accordance with a representative embodiment. The MRI system 100 comprises a magnetic structure 101 with a tube 102 extending therethrough for receiving a patient 103. Other components of the MRI structure, including various electrical and electronic components within the purview of one of ordinary skill in the art are contemplated by the present teachings, but are often not described to avoid obscuring the present teachings.

A local coil 105 is disposed over the patient 103. The local coil 105 may be one of a number of local coils used in MRI applications, and that are known to those of ordinary skill in the art. The local coil 105 may be referred to as a surface coil or a body coil. The local coil 105 comprises RF coils, which are the receivers, and sometimes also the transmitters, of RF signals in the MRI system 100. As described more fully below, the local coil 105 illustratively comprises electronic components that digitize the received RF signals during a scan.

A dongle 106 is connected to the local coil 105. As described more fully below, the dongle 106 comprises a DC power source, which is illustratively a battery (not shown in FIG. 1A). As described more fully below, the battery is adapted to be removed and replaced with a more fully charged battery. Moreover, and as described more fully below, the dongle 106 illustratively comprises a transceiver configured to receive and transmit data received during a scan, as well as to transmit and receive other signals as needed. The dongle 106 may also comprise a heat sink (not shown in FIG. 1A), which like the battery is adapted to be removed and replaced with another heat sink. Finally, the dongle 106 may also comprise a memory (not shown in FIG. 1A), that stores data received by the transceiver during a scan.

An optical fiber 107 is optionally connected to the dongle 106. The optical fiber 107 is adapted to receive data from the local coil 105 received during the scan and transmit the data to a computer (not shown), which provides MR images to a clinician based on the data. Notably, the optical fiber 107 can be foregone in certain embodiments, such as certain representative embodiments described below. Alternatively, the optical fiber 107 can be used in addition to other data transmission methods (e.g., the transceiver in the dongle 106) to provide redundancy.

An apparatus 108 is provided on a wall 109 of the magnet structure, or other location for easy access by the clinician attending the patient 103. As described more fully below, the apparatus 108 comprises a battery charger (not shown in FIG. 1A), a number of charging sites (not shown in FIG. 1A) adapted to receive batteries for charging and storage, and optionally, a number of heat sink sites (not shown in FIG. 1A) configured to store heat sinks, which can be exchanged with the heat sink on the dongle after a scan. Generally, the apparatus 108 is stored in a compartment on the wall 109. As will become clearer as the present description continues, the apparatus 108 allows easy access by a clinician to replace a discharged battery, or a heat sink, or both.

Figure 1B:
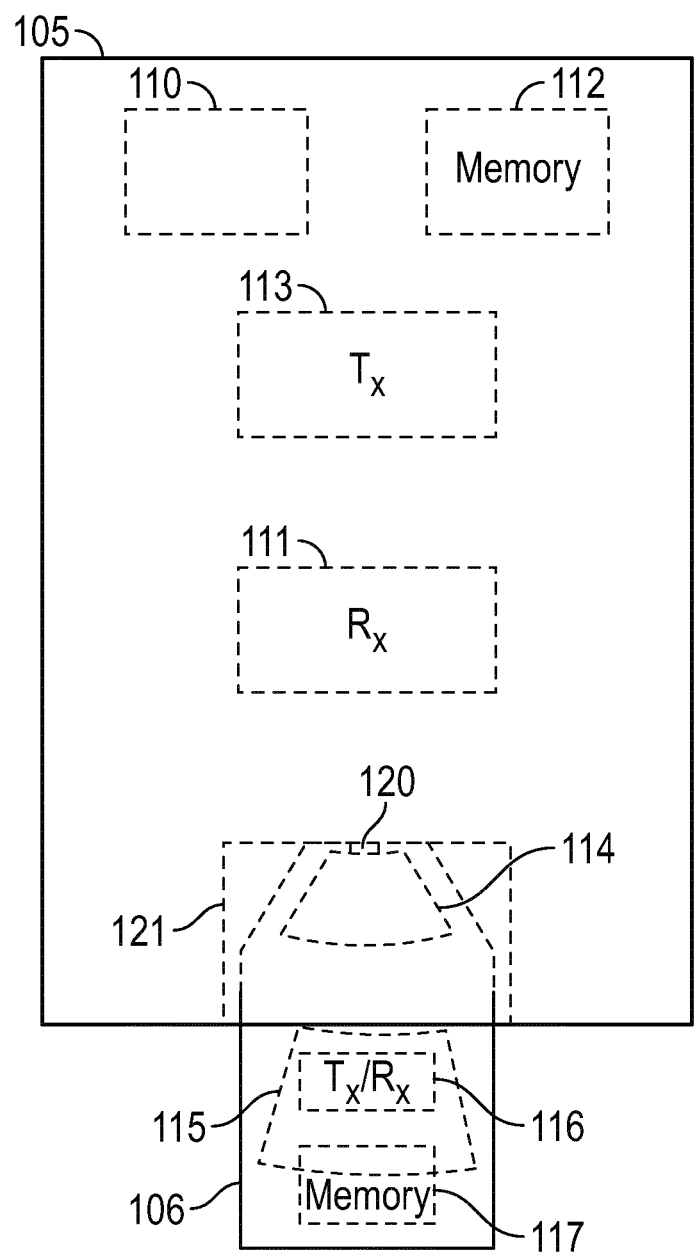
FIG. 1B is a top view of an RF coil with a dongle connected thereto in accordance with a representative embodiment.

FIG. 1B is a top view of the local coil 105 with dongle 106 connected thereto, in accordance with a representative embodiment.

The local coil 105 illustratively comprises electronics 110 configured to receive data from a receiver 111, and to digitize the data from storage in a memory 112. The electronics 110 illustratively comprise electronic and electrical components for digitizing the data for further use in constructing images based on the MR scan of the patient 103.

The analog signals induced in RF coils of the local coil 105 by the nuclear spins are generally amplified with a low noise amplifier and digitized using one or more analog to digital converters (A/D) (not shown) provided, for example, in the local coil 105. By way of example, a bandpass delta sigma A/D may be used in this capacity. Notably, variable gain or compression may be used to cover the entire dynamic range of the possible signals and noise. The digitized data is typically compressed with little or substantially no loss, encoded for error correction, and serialized for transmission.

The local coil 105 also comprises, optionally, a transmitter 113. In certain embodiments, the transmitter 113 is an RF transmitter and usefully transmits the data from the memory 112 to a computer or other device, where the data are used to reconstruct the MR image from the patient scan. Alternatively, and as noted below, the transmission of data may be along an optical waveguide (e.g., optical fiber 107), which is connected to the local coil 105. In this case, the transmitter 113 would comprise an optical transmitter.

The dongle 106 comprises a battery 114, a heat sink 115, and optionally, a transceiver 116, and a memory 117.

The transceiver 116 may comprise a separate transmitter and receiver. Alternatively, the transceiver 116 is replaced with only a receiver. As mentioned above, data acquired during the scan of the patient 103 may be received by the dongle 106, and stored in memory 117. These data may also be transmitted by the transceiver 116 to a computer or other device, and used to reconstruct the MR image from the patient scan. In other embodiments described below, the data in the memory 112 may be downloaded at the apparatus 108 and sent to the computer or other device. In still other embodiments, the memory 132 may be removable from the dongle, and provided for further use.

The memory 112 may comprise non-volatile computer memory, or volatile computer memory, or both, including, but not limited to: a floppy disk, a magnetic hard disk drive, a solid state hard disk, flash memory, a USB thumb drive, Random Access Memory (RAM), Read Only Memory (ROM), programmable read-only memory (PROM), electrically programmable read-only memory (EPROM), electrically erasable and programmable read only memory (EEPROM), universal serial bus (USB) drive, floppy disks, compact disks (CDs), magnetic tape, a smart card, a CD-ROM, a solid state hard drive, an optical disk, a magneto-optical disk, and a register file of the processor. Examples of optical disks include Compact Disks (CD) and Digital Versatile Disks (DVD), for example CD-ROM, CD-RW, CD-R, DVD-ROM, DVD-RW, or DVD-R disks.

As described more fully below, the battery 114 is rechargeable, and provided in a port in the dongle 106 so that upon insertion into the apparatus 108, the battery 114 may be removed, and recharged by the battery charger of the apparatus 108. As will become clearer as the present description continues, in a representative embodiment the battery 114 is replaced in the dongle 106 by a battery having a charge level that is greater than that of battery 114.

The battery 114 provides the DC power to the local coil, and thereby frees the local coil 105 from the constraints of a connection to a power supply. As alluded to above, known local coils that require connections to a power supply through a cable, among other things, are cumbersome, and impede the work of the clinician. By contrast, because the battery 114 is integral to the dongle 106, no such impediments to the clinician exist.

The battery 114 is a rechargeable battery with charge/power requirements dictated by the local coil 105. While known dry-cell rechargeable batteries (e.g., lithium ion batteries) are contemplated, other known rechargeable portable DC power sources are also contemplated by the present teachings. These include, but are not limited to semiliquid lithium ion fuel cells, nickel-metal-hydride (NiMH) fuel cells, potassium ion fuel cells, and hydrogen fuel cells.

The dongle 106 also comprises a heat sink 115. As can be appreciated, during operation, the discharging battery 114 can create heat. Because the battery 114 is in the dongle 106, which in turn, is a disposed in the local coil 105, this heat can be in contact with the patient 103, and can be uncomfortable, if not dangerous to the patient. As such, in such instances it is useful to provide a heat sink which will dissipate the heat from the battery 114. In certain embodiments, the heat sink 115 is a phase-change device. Phase-change devices comprise a phase-change material (PCM) that undergoes a change of phase during heat transfer to the material. These materials, which are sometimes referred to as high-performance heat transfer materials, are commonly used in heat sinks in electronic applications, and are well known to one of ordinary skill in the art. Alternatively, materials with comparatively high thermal coefficients, such as metals, metal alloys and certain ceramic materials, may be used in the heat sink.

Like the battery 114, the heat sink 115 is also provided in a port, and is configured to be removed and stored by the apparatus 108, and replaced with a 'fresh' heat sink.

The dongle 106 is illustratively inserted into a port 121 of the local coil 105. Once the dongle 106 is inserted, the local coil 105 is electrically connected to Input/output (I/O) circuitry 120 of the dongle 106. The I/O circuitry 120 varies in complexity based on the requirements of the device to which it is connected. For example, if the dongle 106 is not adapted to receive data from the local coil 105, but rather to provide only DC power thereto, the I/O circuitry can include only a simple electrical connection. By contrast, if the dongle 106 is configured to receive data from the local coil 105, the I/O circuitry may be configured to control communication therebetween, and act as an interface including necessary logic to interpret input and output signals or data to/from the electronics 110. The I/O circuitry 120 may also be configured to receive RF data during the scan and provide this to the transceiver 116, and to transmit data therefrom.

Figure 2A:
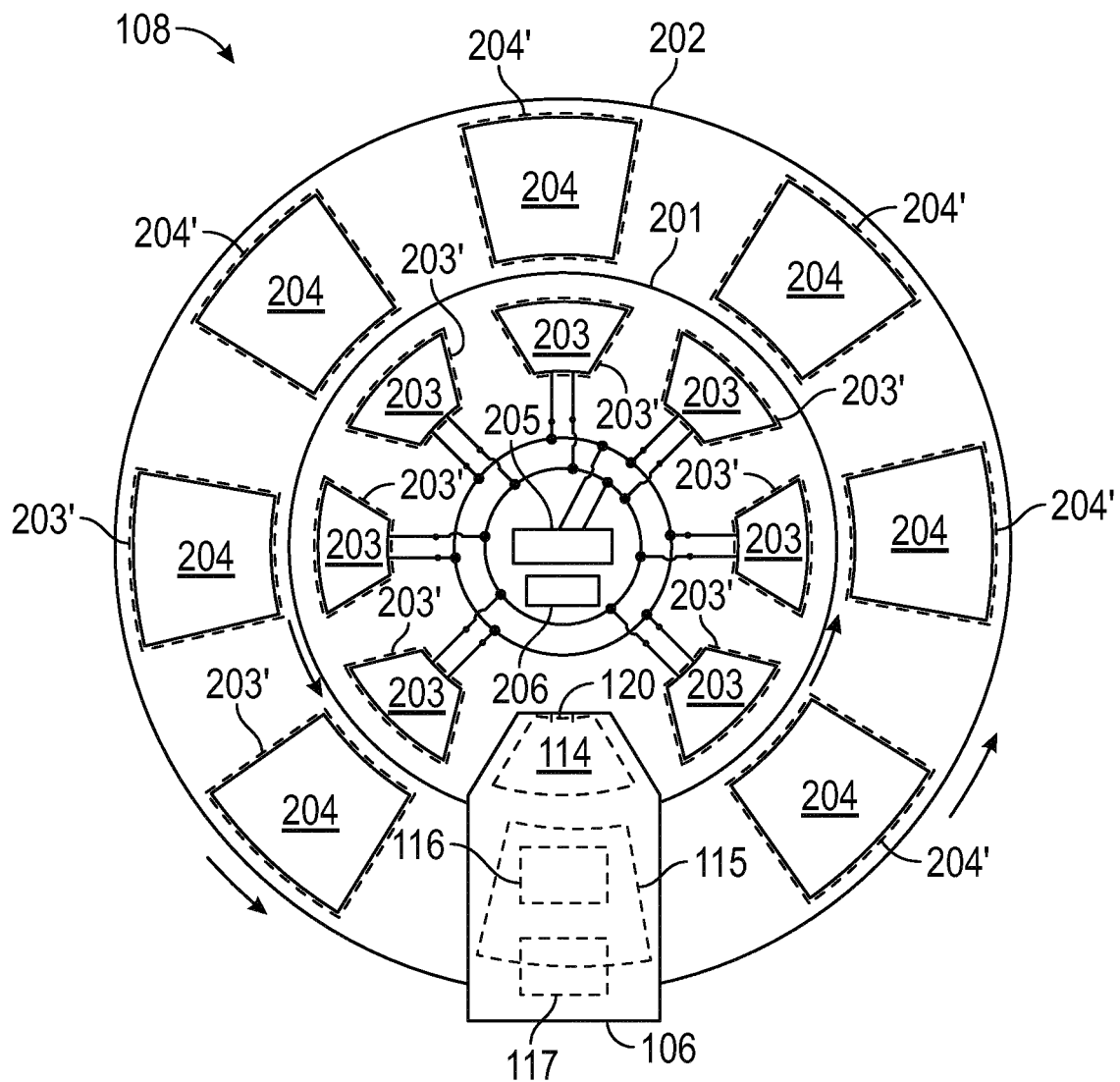
FIG. 2A is a front view of an apparatus in accordance with a representative embodiment.

FIG. 2A is a front view of apparatus 108 in accordance with a representative embodiment. Often, various aspects and details of the various elements described above in connection with the representative embodiments described in connection with FIGS. 1A-1B are common to those of the representative embodiments described in connection with FIG. 2A. These common aspects and details may not be repeated in order to avoid obscuring the description of the presently described representative embodiments.

The apparatus 108 comprises a first carousel 201 and, optionally, a second carousel 202.

The first carousel 201 comprises a plurality of charge sites 203' into which a plurality of batteries 203 are disposed, with one battery 203 being disposed in a respective one of the charge sites 203'.

The second carousel 202 comprises a plurality of heat sink sites 204' into which a plurality of heat sinks 204 are disposed, with one heat sink 204 being disposed in a respective one of the heat sink sites 204'.

The apparatus 108 also comprises a battery charger 205. As depicted, the battery charger 205 is selectively connected to each of the charge sites 203', and is configured to charge the batteries 203 as described more fully below.

The apparatus 108 optionally comprises a monitor 206. The monitor 206 is configured to receive charge state information from the battery charger 205 or from each of the batteries 203 directly. As described more fully herein, charge state information can be used to select one of the plurality of batteries 203 that has the greatest charge, so that battery can be provided to the dongle 106.

As depicted by arrows in FIG. 2A, the first and second carousels 201, 202 are configured to move together or independently. Generally, the first and second carousels 201, 202 are configured to increment by one position of a battery 203, and a heat sink 204, respectively, by action of an actuator (see FIG. 2C), which is illustratively a stepper motor or similar device allowing for comparatively precise motion and stopping. The movement of the first carousel 201 increments a battery 203 into position for receipt by the dongle 106, while moving battery 114 out of the dongle 106 and into a vacant charge site 203'. As such, there is always one empty charge site 203' for receipt of the battery 114 from the dongle 106.

In simplest operation, when the dongle 106 is inserted into the apparatus 108, the battery 114 is disposed in the vacant charge site 203', the first carousel 201 advances so a charged battery 203 is aligned with the dongle 106, and the charged battery 203 is inserted into the dongle 106. Removal of the dongle 106 thus leaves an empty charge site 203'.

Similarly, the movement of the second carousel 202 increments a heat sink 204 into position for receipt by the dongle 106, while moving heat sink 115 out of the dongle 106 and into a vacant heat sink site 204'. As such, there is always one empty heat sink site 204' for receipt of the heat sink 115 from the dongle 106.

When the dongle 106 is inserted into the apparatus 108, the heat sink 115 is disposed in the vacant heat sink site 104', the second carousel 202 advances so a heat sink 204 is aligned with the dongle 106, and the heat sink 204 is inserted into the dongle 106. Removal of the dongle 106 thus leaves an empty heat sink site 204'.

Figure 2B:
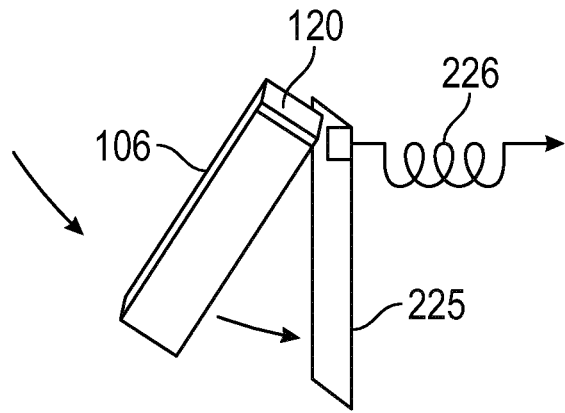
FIG. 2B is a side-view of a cavity of the apparatus configured to receive the dongle, in accordance with a representative embodiment.

FIG. 2B is a side-view of a slot 225 of the apparatus 108 configured to receive the dongle 106, in accordance with a representative embodiment. Again, various aspects and details of the various elements described above in connection with the representative embodiments described in connection with FIGS. 1A-2A are common to those of the representative embodiments described in connection with FIG. 2B. These common aspects and details may not be repeated in order to avoid obscuring the description of the presently described representative embodiments.

In the representative embodiment, the dongle 106 is rotated into the slot 225, allowing I/O circuitry 120 to connect to electrical circuitry 226 of the apparatus 108. The rotation of the dongle 106 into the slot 225 is merely illustrative, and other mechanical methods within the purview of one of ordinary skill in the art are contemplated. For example, the dongle may be inserted by sliding into the slot 225.

Connection of the I/O circuitry 120 to the electrical circuitry 226 effects certain functions of varying complexity depending on the representative embodiment.

In one representative embodiment described below in connection with FIGS. 3A-3B, when the dongle 106 is inserted to slot 225, the battery 114, or the heat sink 115, or both, are disposed in a respective vacant charge site 203', and vacant heat sink site 204'.

Once the battery 114, or heat sink 115, or both, are deposited into the respective vacant charge site 203', and vacant heat sink site 204', the first and second carousels 201, 202 advance, with the dongle 106 remaining fixed. As described more fully below in connection with FIGS. 3A-3B, the dongle 106 is then aligned so a charged battery 203, or a fresh heat sink 204, or both, can be inserted into the dongle 106. Once the charged battery 203, or the fresh heat sink 204, or both are inserted, the dongle 106 can be removed, and used with the local coil 105.

Notably, while the dongle 106 is docked in the apparatus 108, depending on the desired functionality, a number of additional functions can be effected. To this end, in simplest form, when the dongle 106 is docked in the apparatus 108, a charged battery 203 can replace battery 114 in the dongle 106, and the battery 114 can be charged by the apparatus. Additionally, a fresh heat sink 204 can replace the heat sink 115 in the dongle 106, and the heat sink 115 can be allowed to cool in the apparatus.

Since the environment in which the apparatus 108 is disposed is typically maintained at a low room temperature (i.e., ambient temperature), cooling of the heat sink 115 may be passive. Alternatively, a refrigeration system can be deployed within the MRI system 100 to cool the heat sink 115 more rapidly, or below room temperature, or both. Beneficially, cooling the heat sink 115 to a temperature below the ambient temperature increases the amount of stored energy possible as the heat sink could be well below room temperature when inserted into the dongle. This allows the heat sink to be smaller for the same energy capacity.

Figure 2C:
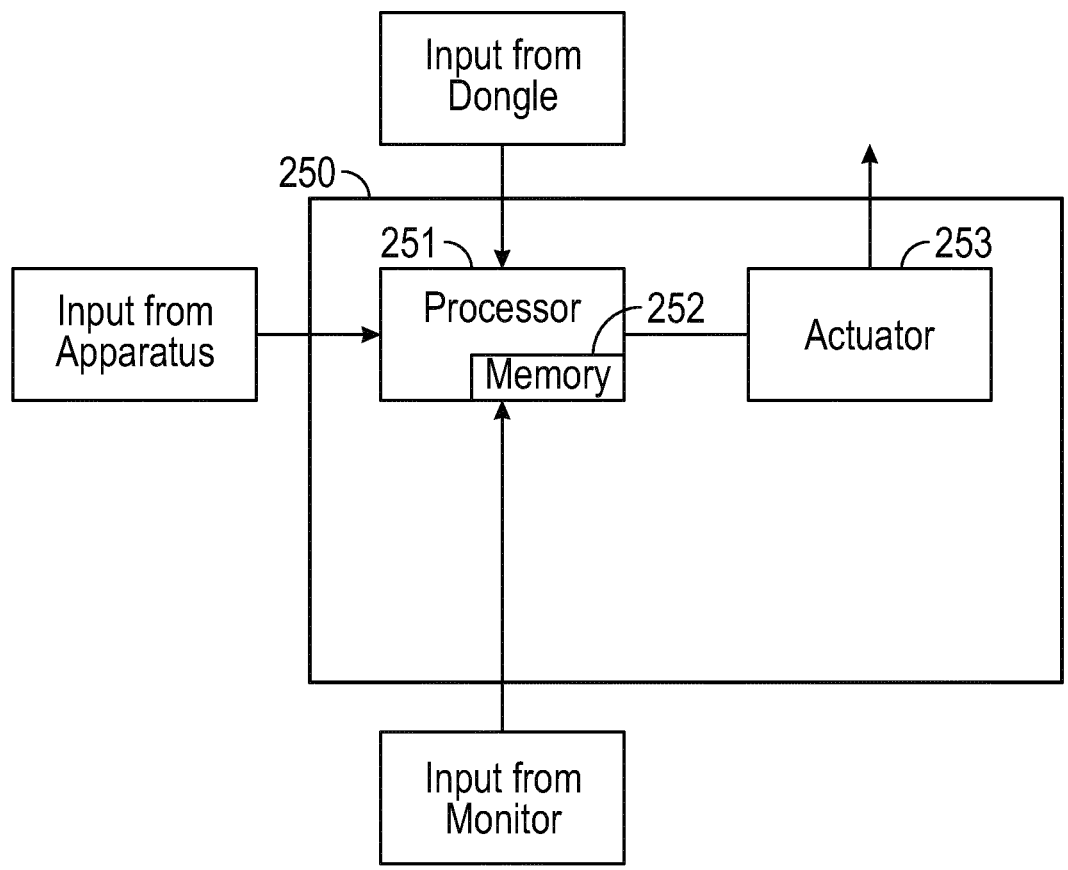
FIG. 2C is a simplified schematic block diagram of a controller in accordance with a representative embodiment.

However, more complex functionality is contemplated by the present teachings. Referring to FIG. 2C, a simplified schematic block diagram of a controller 250 in accordance with a representative embodiment is described. The controller 250 is generally a component of or connected to the apparatus 108. Illustratively, the controller 250 may be a component of the controller or the computer of the MRI system 100.

The controller 250 comprises a processor 251 and a memory 252. The controller 250 is generally configured to provide one or more control commands to control the exchange of a used battery (battery 114) with a charged battery (battery 203), as well as the exchange of a spent heat sink (heat sink 115) with a fresh heat sink (heat sink 204). In one operation, inputs from the apparatus are received by the processor 251, and based on these inputs, a control command is sent to an actuator 253 to move one or both of the first and second carousels 201, 202.

More generally, the processor 251 is configured to acquire and process data based on inputs from the apparatus 108, and from the dongle 106. The memory 252 stores data from the apparatus 108, and from the dongle 106, as well as machine readable instructions (programs) configured to be executed by the processor 251. As will be appreciated by one of ordinary skill in the art, the memory 252 is a non-statutory computer-readable medium having stored therein machine readable instructions configured to be executed by a processor 251 to perform various methods, such as controlling the apparatus 108.

The processor 251 may comprise one or more microprocessors that may be programmed using software (e.g., microcode) to perform various functions discussed herein. Notably, the processor 251 may comprise more than one processor or processing core. The processor 251 may for instance be a multi-core processor. The processor 251 may also comprise a collection of processors within a single computer system (not shown) or distributed among multiple computer systems (not shown) associated with the MRI system 100. As will be appreciated as the present description continues, many programs have their machine-readable instructions performed by the processor 251 that may be within the same computing device or which may even be distributed across multiple computing devices.

Examples of components that may be employed as the processor 251 in various embodiments of the present disclosure include, but are not limited to, conventional microprocessors, microcontrol units, application specific integrated circuits (ASICs), and field-programmable gate arrays (FPGAs).

The memory 252 is configured to store software useful to the processor 251, and various types of data gathered during the course of the function of the various components of the apparatus 108, and the dongle 106. These data include data from the local coil 105, as well as data related to the current charge state of batteries 203, and battery 114, as described below.

Furthermore, the memory 252 stores machine readable instructions configured to be executed by the processor 251 to control the MRI system 100. These instructions (programs) are encoded in the memory 252, and when executed on the processor 251, perform at least some of the functions discussed herein. (The terms "program" or "computer program" are used herein in a generic sense to refer to any type of computer code (e.g., software or microcode) that can be employed to program the processor 251.) For example, and as described more fully herein, machine readable instructions stored in memory 252 are configured to be executed by the processor 251 to control the first and second carousels 201, 202, as well as the battery charger 205. Furthermore, the machine readable instructions, through the processor 251, are configured to perform a method, which is described more fully below, to select the battery 203 among the plurality of batteries 203 that has the greatest charge, and to advance the first carousel 201 to provide this battery to the dongle.

The memory 252 may comprise non-volatile computer memory, or volatile computer memory, or both, including, but not limited to: a floppy disk, a magnetic hard disk drive, a solid state hard disk, flash memory, a USB thumb drive, Random Access Memory (RAM), Read Only Memory (ROM), programmable read-only memory (PROM), electrically programmable read-only memory (EPROM), electrically erasable and programmable read only memory (EEPROM), universal serial bus (USB) drive, floppy disks, compact disks (CDs), magnetic tape, etc., a smart card, a digital versatile disc (DVD), a CD-ROM, a solid state hard drive, an optical disk, a magneto-optical disk, and a register file of the processor. Examples of optical disks include Compact Disks (CD) and Digital Versatile Disks (DVD), for example CD-ROM, CD-RW, CD-R, DVD-ROM, DVD-RW, or DVD-R disks. Various storage media may be fixed within the processor 251 or may be transportable, such that the one or more programs stored thereon can be loaded into the processor 251 so as to implement various aspects of the present teachings discussed herein.

A hardware interface (not shown) is provided between the controller 250, and the dongle 106 and the apparatus 108 enables the processor 251 to interact with various components thereof. The hardware interface may allow the processor 251 to send control signals or instructions to various components of the apparatus 108 and the dongle 106, as well as to an external computing device and/or apparatus. The hardware interface may also enable the processor 251 to exchange data with various components of the apparatus 108 and the dongle 106, as well as with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

In accordance with a representative embodiment, the processor 251 receives input from the monitor 206. This input includes data on the current charge state of each battery 203 of the plurality of batteries 203. If based on a comparison of the various charge states, the processor 251 determines the charge state of each of the batteries 203 is the same, and is greater than that of the battery 114 currently in the dongle 106, the processor 251 sends a command to advance the first carousel 201 by one increment so that the next battery 203 is provided to the dongle 106. However, if the determination is made by the dongle 106 that the charge state of the battery 114 in the dongle 106 is greater than that of any other battery 203 in the apparatus 108, the command is sent to the actuator not to advance. Rather, notification is provided regarding the relative charge states of the batteries 114, 203. Based on this notification, the clinician can decide the next steps.

If, by contrast, based on a comparison of the various charge states, the processor 251 determines the charge state of one or more of the batteries 203 is greater than that of the battery 114 currently in the dongle 106, the processor 251 sends a command to advance the first carousel 201 by the necessary number of increments so the first battery 203 with the comparatively high charge state is provided to the dongle 106.

Finally, data from the memory 117 may be provided to the processor 251. These data may be raw data, requiring digitization, or may be digitized data. Regardless, the data may be provided from the processor 251 to a computer of the MRI system 100, which provides MR images to a clinician based on the data.

Figure 3A:
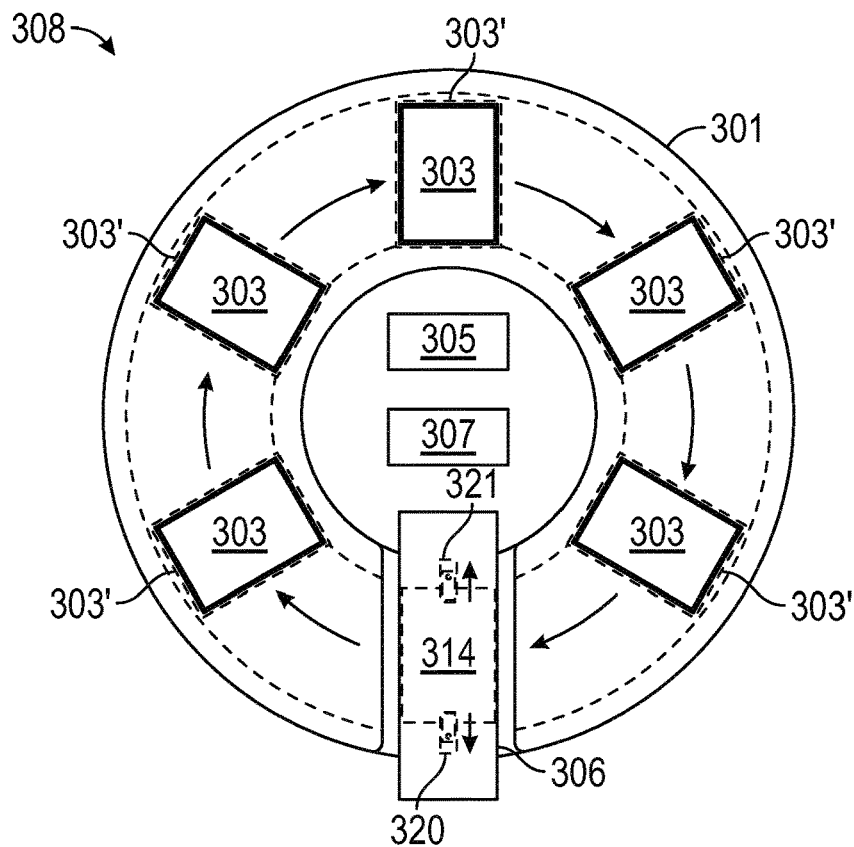
FIG. 3A is a front view of an apparatus in accordance with a representative embodiment.

FIG. 3A is a front view of an apparatus 308 in accordance with a representative embodiment. Often, various aspects and details of the various elements described above in connection with the representative embodiments described in connection with FIGS. 1A-3B are common to those of the representative embodiments described in connection with FIG. 3A. These common aspects and details may not be repeated in order to avoid obscuring the description of the presently described representative embodiments.

The apparatus 308 comprises a carousel 301. Another carousel, similar to second carousel 202 may also be provided to hold heat sinks (not shown in FIG. 3A) and heat sink sites (also not shown in FIG. 3A). Notably, the ejection and insertion mechanism for exchanging batteries described presently is applicable to the exchange of a spent heat sink with a fresh heat sink.

The carousel 301 comprises a plurality of charge sites 303' into which a plurality of batteries 303 are disposed, with one battery 303 being disposed in a respective one of the charge sites 303'.

The apparatus 308 also comprises a battery charger 305. As depicted, the battery charger 305 is selectively connected to each of the charge sites 303', and is configured to charge the batteries 303 as described more fully below.

The apparatus 308 optionally comprises a monitor 307. The monitor 307 is configured to receive charge state information from the battery charger 305 or from each of the batteries 303 directly.

As depicted by arrows in FIG. 3A, the carousel 301 is configured to increment by one position of a battery 303, by action of an actuator (see FIG. 2C), which is illustratively a stepper motor or similar device allowing for comparatively precise motion and stopping. The movement of the carousel 301 increments a battery 303 into position for receipt by the dongle 306, while moving battery 314 out of the dongle 306 and into a vacant charge site 303'. As such, there is always one empty charge cite 303' for receipt of the battery 314 from the dongle 306.

Figure 3B:
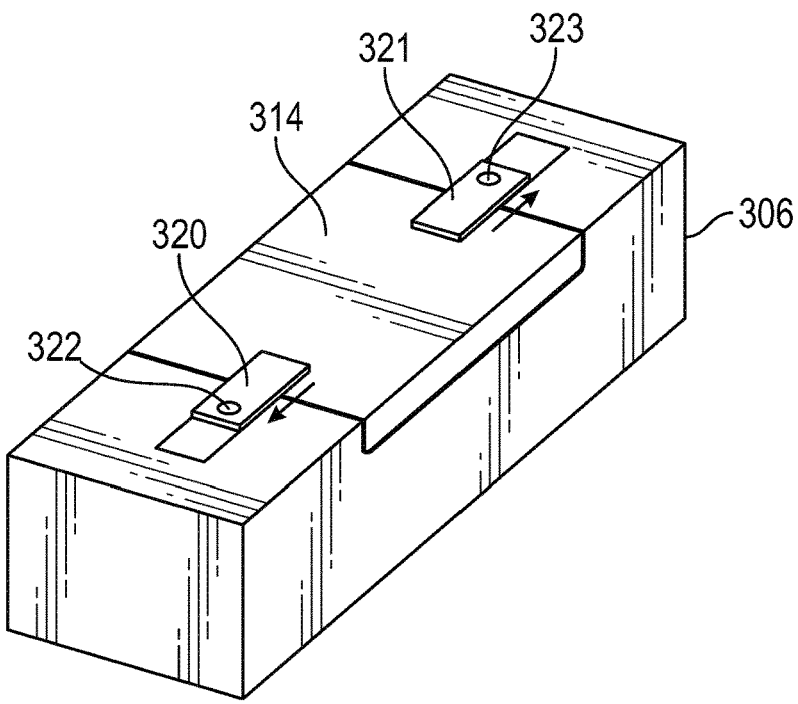
FIG. 3B is a perspective view of a dongle in accordance with a representative embodiment.

As depicted in FIG. 3B, the dongle 306 comprises first and second battery retainers 320, 321, with first and second holes 322 and 323, respectively. When the dongle 306 is inserted into the apparatus 308, battery release mechanisms on the apparatus 308 engage the first and second holes 322, 323, and pull the first and second retainers 320, 321 away to enable release of the battery 314 and its insertion into a vacant charge site 203' of the apparatus 308. The battery 114 is disposed in the vacant charge site 203' beneath the battery 114. The carousel 301 advances so a charged battery 303 is aligned with the dongle 306. The release mechanism engages the first and second openings 322,323, pulling them again in the directions of the arrows, enabling the charged battery 303 to be inserted into the dongle 306. Removal of the dongle 306 thus leaves an empty charge site 303'.

Again, as noted above, exchange of a heat sink in the dongle 306 with a fresh heat sink could be effected in substantially the same manner, and with substantially the components as those described in connection with the exchange of battery 314. As noted above, the present teachings contemplate the inclusion of a non-transitory computer-readable storage medium having stored therein machine readable instructions configured to be executed by a processor (e.g., processor 251) to control an apparatus (e.g., apparatuses 108, 308). In one representative embodiment, the machine readable instructions are configured to perform a method to exchange a battery (e.g., batteries 114, 314) in a dongle (e.g., dongles 106, 306). The method comprises: receiving a current level of charge for each of a plurality of batteries 203, 303 disposed in respective charge sites 203', 303' in a carousel (e.g., 101, 301) of the apparatus; determining which of the plurality of batteries has a greatest level of charge; receiving a level of charge of a dongle battery; comparing the greatest level of charge with the level of charge of the dongle battery; and advancing the carousel to replace the dongle battery with the battery having the greatest level of charge when the greatest level of charge is greater than the level of charge.

Figure 4:
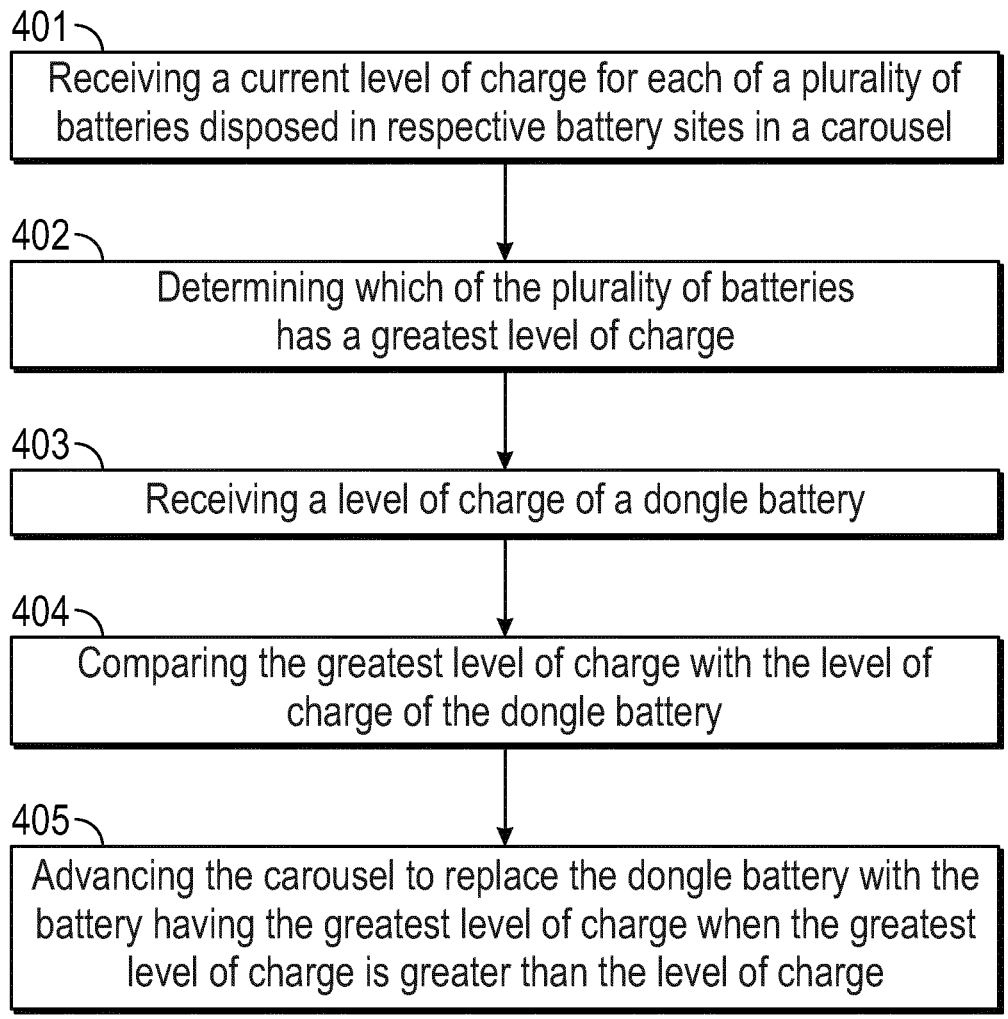
FIG. 4 is a flow chart of a method in accordance with a representative embodiment.

Turning to FIG. 4, a flow-chart of the method is shown.

At 401, the method comprises receiving a current level of charge for each of a plurality of batteries (e.g., 203, 303 disposed in respective charge sites 203', 303' in a carousel (e.g., 101, 301) of the apparatus.

At 402, the method comprises determining which of the plurality of batteries has a greatest level of charge.

At 403, the method comprises receiving a level of charge of a dongle battery.

At 404, the method comprises comparing the greatest level of charge with the level of charge of the dongle battery.

At 405, the method comprises advancing the carousel to replace the dongle battery with the battery having the greatest level of charge when the greatest level of charge is greater than the level of charge of the dongle battery.

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

What is claimed is:

1. A dongle configured to be electrically and mechanically connected with an electrical device, comprising:
    a battery configured to provide direct current (DC) power to the electrical device when the dongle is electrically and mechanically connected to the electrical device, the battery being adapted to be removed from the dongle, recharged, and replaced in the dongle by another battery; and
    a heat sink configured to dissipate heat generated by the battery, the heat sink being adapted to be removed from the dongle, cooled, and replaced in the dongle by another heat sink.

2. The dongle of claim 1, further comprising a transceiver configured to receive data from the electrical device, and to transmit the data.

3. The dongle of claim 2, further comprising a memory, the memory being configured to be removed from the dongle, and replaced with another memory.

4. The dongle of claim 1, wherein the heat sink comprises a phase changing material.

5. The dongle of claim 1, wherein the heat sink comprises a material having a thermal conductivity great enough to foster heat exchange from the battery.

6. The dongle of claim 5, wherein the heat sink comprises a ceramic material.

7. The dongle of claim 5, wherein the heat sink comprises a metal or a metal alloy.

8. The dongle of claim 2, wherein the transceiver is configured to transmit and receive radio frequency signals.

9. An apparatus, comprising:
    a carousel comprising a cavity into which a dongle including a battery is inserted;
    a plurality of charge sites;
    a switch disposed in the cavity, the switch being depressed upon insertion of the dongle into the cavity; and
    a battery charger connected to the plurality of charge sites, each charge site configured to receive and charge the received battery, wherein, when the battery is removed from the dongle and disposed in one of the charge sites, the carousel advances, and a battery disposed in another charge site is inserted into the dongle.

10. An apparatus comprising:
    a first carousel comprising:
        a cavity into which a dongle is inserted,
        a switch disposed in the cavity, the switch being activated upon insertion of the dongle into the cavity, and
        a battery charger connected to a plurality of charge sites, each charge site configured to receive and charge a battery, wherein, when a battery is removed from the dongle and disposed in one of the charge sites, the carousel advances, and a battery disposed in a charge site is inserted into the dongle, and
    a second carousel comprising a plurality of heat sinks sites, each heat sink site configured to receive a heat sink, wherein upon insertion of the dongle into the cavity, a heat sink disposed in the dongle is removed and disposed in one of the heat sink sites, the carousel advances, and one of the plurality of heat sinks is inserted into the dongle.

11. The apparatus of claim 9, wherein the battery charger comprises a monitor for each battery disposed in a battery site, the monitor being configured to provide a current level of charge for each battery disposed in a battery site.

12. The apparatus of claim 11, further comprising:
    a controller configured to receive the current level of charge for each battery site, and to compare the current levels of charge to determine which battery has the greatest charge in the carousel.

13. The apparatus of claim 12, wherein the carousel is connected to an actuator configured to advance the carousel based on a command from the controller.

14. The apparatus of claim 13, wherein the command from the controller advances the carousel so the battery with the greatest charge is inserted into the dongle.

15. The apparatus of claim 10, wherein at least one of the plurality of heat sinks comprises a phase change material.

16. The apparatus of claim 10, wherein at least one of the plurality of heat sinks comprises a metal or a metal alloy.

17. The apparatus of claim 10, wherein at least one of the plurality of heat sinks the comprises a ceramic material.

18. The apparatus of claim 12, wherein the controller is configured to receive data from the dongle and to store the data in a memory, or to transmit the data to a computer, or both.

19. The apparatus of claim 18, wherein the data are stored in a memory of the dongle.

20. A non-transitory computer-readable storage medium having stored therein machine readable instructions configured to be executed by a processor to control an apparatus to perform a method of exchanging a battery in a dongle, the method comprising:
    receiving a current level of charge for each of a plurality of batteries disposed in respective battery charging sites in a carousel of the apparatus;
    determining which of the plurality of batteries has a greatest level of charge;
    receiving a level of charge of a dongle battery;
    comparing the greatest level of charge with the level of charge of the dongle battery; and
    advancing the carousel and replacing the dongle battery with the battery having the greatest level of charge when the greatest level of charge is greater than the level of charge of the dongle battery.

\* \* \* \* \*